US010388813B2

(12) United States Patent
Hasegawa et al.

(10) Patent No.: US 10,388,813 B2
(45) Date of Patent: Aug. 20, 2019

(54) SOLAR CELL MODULE

(71) Applicant: PANASONIC INTELLECTUAL PROPERTY MANAGEMENT CO., LTD., Osaka-shi, Osaka (JP)

(72) Inventors: Isao Hasegawa, Osaka (JP); Kaori Misawa, Osaka (JP)

(73) Assignee: PANASONIC INTELLECTUAL PROPERTY MANAGEMENT, Osaka-shi (JP)

(*) Notice: Subject to any disclaimer, the term of this patent is extended or adjusted under 35 U.S.C. 154(b) by 102 days.

(21) Appl. No.: 15/414,905

(22) Filed: Jan. 25, 2017

(65) Prior Publication Data
US 2017/0133536 A1 May 11, 2017

Related U.S. Application Data

(63) Continuation of application No. PCT/JP2015/004271, filed on Aug. 25, 2015.

(30) Foreign Application Priority Data

Aug. 28, 2014 (JP) ................... 2014-174136

(51) Int. Cl.
H01L 31/05 (2014.01)
H01L 31/18 (2006.01)
(Continued)

(52) U.S. Cl.
CPC .... *H01L 31/0508* (2013.01); *H01L 31/02013* (2013.01); *H01L 31/1876* (2013.01); *H01L 31/0488* (2013.01); *Y02E 10/50* (2013.01)

(58) Field of Classification Search
CPC .......... H01L 31/0508; H01L 31/02013; H01L 31/1876; H01L 31/0488; H01L 31/042; H01S 40/36; H02S 40/30
(Continued)

(56) References Cited

U.S. PATENT DOCUMENTS

2005/0161832 A1 7/2005 Saeki
2011/0220168 A1* 9/2011 Park ................. H01L 31/02168
136/244

(Continued)

FOREIGN PATENT DOCUMENTS

CN 103811574 A 5/2014
DE 11 2014 000 397 T5 9/2015
(Continued)

OTHER PUBLICATIONS

Office Action dated Sep. 30, 2017, issued in counterpart Chinese Application No. 201580046656.X, with English translation. (10 pages).
(Continued)

*Primary Examiner* — Eli S Mekhlin
*Assistant Examiner* — Kourtney R S Carlson
(74) *Attorney, Agent, or Firm* — Westerman, Hattori, Daniels & Adrian, LLP

(57) ABSTRACT

This solar cell module comprises: a base member curved in the vertical direction and the horizontal direction; a plurality of solar cells disposed on the base member; first wiring members connecting adjacent solar cells to one another in the vertical direction and forming a plurality of strings; and second wiring members connected to the first wiring members that extend out in the vertical direction from the top of the solar cells located at an end of the columns of the strings. The interval between the at least some of the second wiring members and the solar cells of the strings connected to those wiring members is narrower toward the end portions in the horizontal direction of the string group than toward the central portion in the horizontal direction.

5 Claims, 4 Drawing Sheets

(51) Int. Cl.
  *H01L 31/02* (2006.01)
  *H01L 31/0475* (2014.01)
  *H01L 31/048* (2014.01)

(58) Field of Classification Search
  USPC .................................................. 136/242–265
  See application file for complete search history.

(56) References Cited

U.S. PATENT DOCUMENTS

| 2013/0160823 | A1 | 6/2013 | Khouri et al. |
| 2013/0160826 | A1* | 6/2013 | Beckerman ......... H01L 31/0488 136/251 |
| 2014/0130848 | A1 | 5/2014 | Takechi et al. |
| 2015/0303337 | A1 | 10/2015 | Ishii et al. |

FOREIGN PATENT DOCUMENTS

| JP | 2002-231990 A | 8/2002 |
| JP | 2005-191422 A | 7/2005 |
| JP | 2014-96511 A | 5/2014 |
| WO | 2014/109281 A1 | 7/2014 |

OTHER PUBLICATIONS

International Search Report dated Oct. 20, 2015, issued in counterpart International Application No. PCT/JP2015/004271 (1 page).
Extended (supplementary) European Search Report dated Jul. 19, 2017, issued in counterpart European Application No. 15835736.8. (6 pages).
International Preliminary Report on Patentability (Form PCT/IB/373) issued in counterpart International Application No. PCT/JP2015/004271 dated Feb. 28, 2017, with Form PCT/IB/338, PCT/IB/308, PCT/IB/326, and PCT/ISA/237, with English translation (12 pages).

* cited by examiner

SOLAR CELL MODULE

CROSS-REFERENCE TO RELATED APPLICATIONS

The present application is a continuation under 35 U.S.C. § 120 of PCT/JP2015/004271, filed Aug. 25, 2015, which is incorporated herein by reference and which claimed priority to Japanese Patent Application No. 2014-174136 filed on Aug. 28, 2014. The present application likewise claims priority under 35 U.S.C. § 119 to Japanese Patent Application No. 2014-174136 filed on Aug. 28, 2014, the entire content of which is also incorporated herein by reference.

TECHNICAL FIELD

The present disclosure relates to a solar cell module and a method of manufacturing a solar cell module.

BACKGROUND

A solar cell module is known in which a group of strings of solar cells are placed over a substrate having a three-dimensional curvature (hereinafter referred to as "curved substrate") (for example, refer to Patent Literature 1). As described in Patent Literature 1, a solar cell module which is three-dimensionally curved is desirably manufactured, from the viewpoint of productivity or the like, by placing the group of strings over the curved substrate after the group of strings have been manufactured on a flat surface.

CITATION LIST

Patent Literature

Patent Literature 1: JP 2014-96511 A

SUMMARY

When the group of strings are placed over the curved substrate, there is a possibility, for example, that a spacing between strings is narrowed at a part of the group of strings, the solar cells contact each other, and consequently, short-circuiting, cell cracking or the like occurs. In addition, in the group of strings placed over the curved substrate, because a large load tends to be applied on a wiring member, it is desired to reduce the load and to thereby improve the reliability.

According to one aspect of the present disclosure, there is provided a solar cell module comprising: a substrate which is curved in a longitudinal direction and in a lateral direction; a plurality of solar cells placed over the substrate; first wiring members that connect adjacent solar cells to each other in a longitudinal direction to form a plurality of strings in each of which a plurality of the solar cells are arranged in one line; and second wiring members that are connected to the first wiring members which extend from a region above the solar cell positioned at an end of a row of the string in the longitudinal direction, and at least one of which connects adjacent strings in the lateral direction to form a group of strings, wherein a spacing between at least one of the second wiring members and the solar cell positioned at the end of the row of the string to which the wiring member is connected is narrower at a side of an end of the group of strings in the lateral direction than at a side of a central portion in the lateral direction.

According to another aspect of the present disclosure, there is provided a method of manufacturing a solar cell module, comprising: connecting adjacent solar cells to each other by first wiring members in a longitudinal direction, to form a plurality of strings in each of which a plurality of the solar cells are arranged in one line; connecting second wiring members to the first wiring members which extend from a region above the solar cell positioned at an end of a row of the string in a longitudinal direction, to connect adjacent strings by at least one of the second wiring members to form a group of strings; and placing the group of strings over a substrate which is curved in a longitudinal direction and in a lateral direction, wherein when the group of strings is formed, the second wiring members are connected to the first wiring members in such a manner that a spacing between at least one of the second wiring members and the solar cell positioned at the end of the row of the string to which the wiring member is connected is narrower at a side of an end of the group of strings in the lateral direction than at a side of a central portion in the lateral direction.

According to an aspect of the present disclosure, in a solar cell module which is three-dimensionally curved, a superior arrangement state of the solar cells can be obtained without occurrence of short-circuiting, cell cracking, or the like due to contact of the solar cells. In addition, load applied to the wiring member can be reduced and the reliability can be consequently improved.

DESCRIPTION OF EMBODIMENTS

Figure 1:
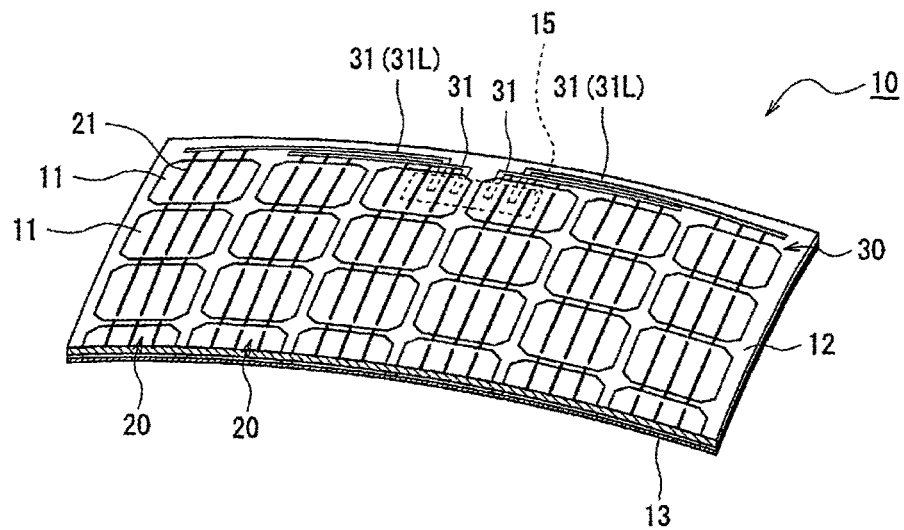
FIG. 1 is a perspective diagram of a solar cell module according to a first embodiment of the present disclosure, viewed from a light receiving surface side (also showing a cross section in the lateral direction of the solar cell module).

Examples of embodiments of the present disclosure will now be described in detail with reference to the drawings.

The drawings referred to in the embodiments are schematically drawn, and the size, ratio, or the like of the constituent elements drawn in the drawings may differ from the actual structure. The specific size, ratio, or the like should be determined in consideration of the following description.

In the present specification, a term "longitudinal direction" and a term "lateral direction" are used as terms indicating directions. The longitudinal direction refers to a direction along which the solar cells of the string are arranged. The lateral direction refers to a direction orthogonal to the longitudinal direction, and is a direction along which the strings of the group of strings are arranged. Further, a description "providing a second member over a first member" is not intended to mean only the case where the first and second members are provided in direct contact with each other, unless otherwise specified. That is, such a description includes a case where another member exists between the first and second members.

In the following, a surface in a solar cell module where the solar light is primarily incident (exceeding 50% and up to 100%) is referred to as a "light receiving surface", and a surface opposite to the light receiving surface is referred to as a "back surface". The terms of the light receiving surface and the back surface are also used for constituent elements of the solar cell or the like.

First Embodiment

Figure 2:
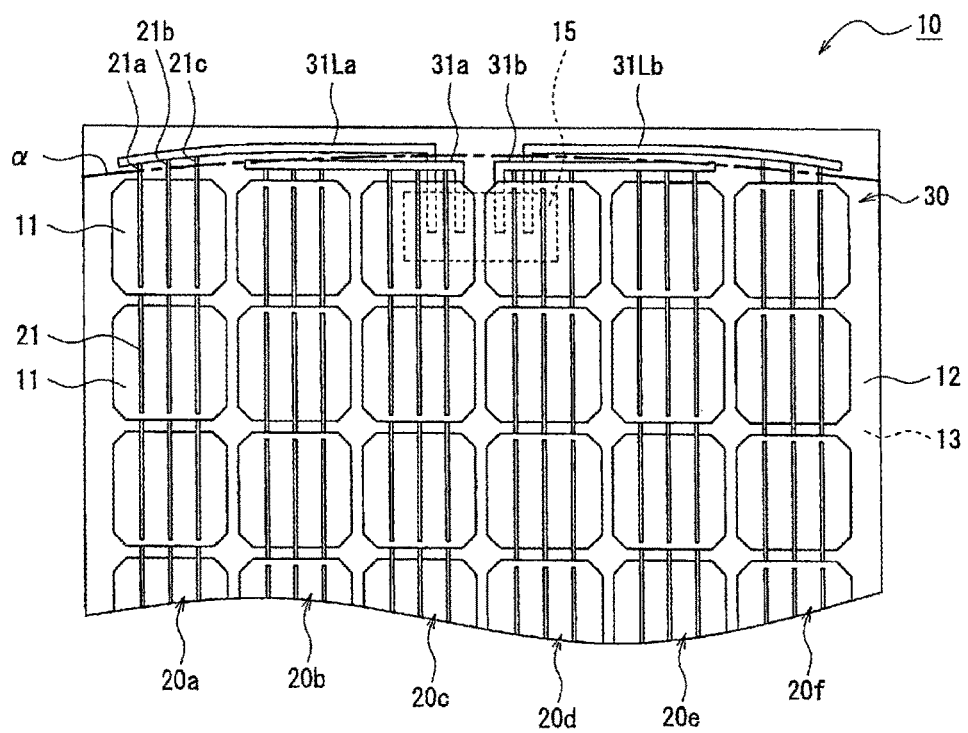
FIG. 2 is a plan view of the solar cell module according to the first embodiment of the present disclosure, viewed from the light receiving surface side.
Figure 3:
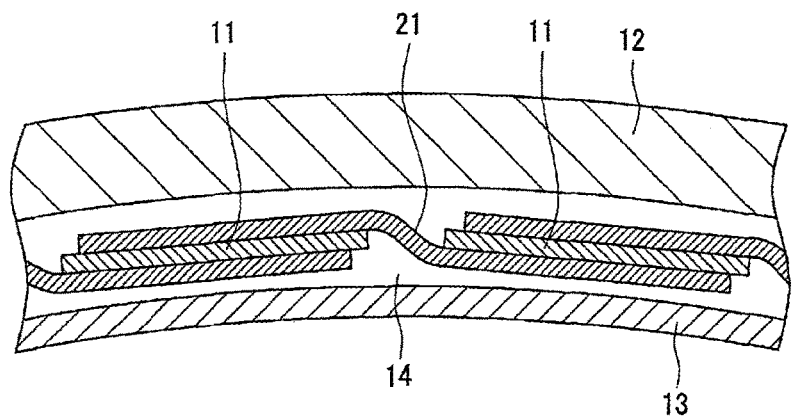
FIG. 3 is a diagram showing a part of a cross section, in a longitudinal direction, of the solar cell module according to the first embodiment of the present disclosure.

A solar cell module 10 according to a first embodiment of the present disclosure will now be described in detail with reference to FIGS. 1~4. FIG. 1 and FIG. 2 are respectively a perspective view and a plan view of the solar cell module 10, viewed from a light receiving surface side. FIG. 3 is a diagram showing a part of a cross section in a longitudinal direction of the solar cell module 10.

As shown in FIGS. 1~3, the solar cell module 10 comprises a plurality of solar cells 11, a first protection component 12 provided on a side of a light receiving surface of the solar cell 11, and a second protection component 13 provided on a side of a back surface of the solar cell 11. The plurality of solar cells 11 are sandwiched and held between the first protection component 12 and the second protection component 13, and are sealed by an encapsulant 14 (refer to FIG. 3) filled between the protection components.

The solar cell module 10 comprises a substrate which is curved in a longitudinal direction and in a lateral direction, and has a three-dimensionally curved shape. In the present embodiment, the first protection component 12 is the substrate which is curved in the longitudinal direction and in the lateral direction and which has a three-dimensional curvature. As will be described later in detail, the second protection component 13, the encapsulant 14, and a group of strings 30 (refer to FIGS. 1 and 2) are placed over the first protection component 12, to obtain the solar cell module 10 which is three-dimensionally curved.

The solar cell module 10 comprises a first wiring member 21 which connects adjacent solar cells 11 in the longitudinal direction to form a plurality of strings 20 (refer to FIGS. 1 and 2) in each of which a plurality of the solar cells 11 are arranged in a line. The first wiring member 21 is, for example, bent in a thickness direction of the module between adjacent solar cells 11, and is attached using adhesive or the like to an electrode on the light receiving surface side of one solar cell 11 and to an electrode on the back surface side of the other solar cell 11 (refer to FIG. 3).

The solar cell module 10 comprises a second wiring member 31 which is connected to the first wiring member 21 extending, in the longitudinal direction, from a region above a solar cell 11 positioned at an end of a row of the string 20 (refer to FIGS. 1 and 2). At least one of the second wiring members 31 connects adjacent strings 20 in the lateral direction, to form the group of strings 30. That is, the group of strings 30 is formed from a plurality of the strings 20 and a plurality of the second wiring member 31. In the present embodiment, 6 rows of strings 20 (referred to as strings 20a, 20b, 20c, 20d, 20e, and 20f from left to right of FIG. 2) are placed in the lateral direction to form the group of strings 30.

The solar cell module 10 desirably comprises a terminal portion 15 (refer to FIGS. 1 and 2) to which at least a part of the second wiring members 31 is connected. In the present embodiment, the terminal portion 15 is provided at a back side of the second protection component 13, and four second wiring members 31 placed on the side of one end in the longitudinal direction of the solar cell module 10 are connected to the terminal portion 15. Of the four second wiring members 31, two connect adjacent strings 20, and the remaining two connect one row of strings 20 and the terminal portion 15. It is desirable that an electric power cable connected to an external device is connected to the terminal portion 15, and a bypass diode for stabilizing output is provided.

The solar cell 11 comprises a photoelectric conversion unit which produces carriers upon receiving solar light. The photoelectric conversion unit has, as electrodes for collecting the produced carriers, a light receiving surface electrode formed over the light receiving surface of the photoelectric conversion unit and a back surface electrode formed over the back surface, for example (both of which are not shown in the figures). The wiring members 21 are connected to the electrodes. However, the structure of the solar cell 11 is not limited to this structure, and the structure may be, for example, a structure in which the electrode is formed only over the back surface of the photoelectric conversion unit. Desirably, the back surface electrode is formed in a larger area than the light receiving surface electrode, and a surface having a larger electrode area (or a surface on which the electrodes are formed) may be considered as the back surface of the solar cell 11.

The photoelectric conversion unit comprises a semiconductor substrate made of, for example, crystalline silicon (c-Si), gallium arsenide (GaAs), indium phosphide (InP), or the like, an amorphous semiconductor layer formed over the semiconductor substrate; and a transparent conductive layer formed over the amorphous semiconductor layer. As a specific example, a structure may be employed in which an i-type amorphous silicon layer, a p-type amorphous silicon layer, and a transparent conductive layer are sequentially formed over one surface of an n-type monocrystalline silicon substrate, and an i-type amorphous silicon layer, an n-type amorphous silicon layer, and a transparent conductive layer are sequentially formed over the other surface. The transparent conductive layer is desirably formed from a transparent conductive oxide in which a metal oxide such as indium oxide ($In_2O_3$) and zinc oxide (ZnO) is doped with Sn, Sb, or the like.

For the first protection component 12 and the second protection component 13, for example, a glass substrate, a resin substrate, a resin film, or the like may be employed. For the first protection component 12, a member having a light transmissive characteristic is used, and from the viewpoint of heat resistivity and endurance, a glass substrate is desirably used. A thickness of the glass substrate is, for example, about 2~6 mm. For the second protection component 13, a transparent member may be used or a non-transparent member may be used. For the second protection component 13, for example, a resin film is used. A thickness of the resin film is, for example, about 50~300 μm.

In the present embodiment, as described above, as the substrate which is curved in the longitudinal direction and in the lateral direction, the first protection component 12 is used. The first protection component 12 is not particularly limited so long as the component has a curved surface which is curved in the longitudinal direction and in the lateral direction, and has, for example, a curved surface with a three-dimensional curvature such as a shape corresponding to a part of a spherical surface that is cut out. The curvature of the first protection component 12 is not particularly limited, and may be constant over the entire region of the first protection component 12 or different at a part of the regions. In the following, a structure is described in which the curvature of the first protection component 12 is approximately constant. The first protection component 12 is, for example, a transparent glass substrate which is three-dimensionally curved with an approximately constant curvature, and has an approximately rectangular shape in the plan view. In the present specification "approximately" is intended to include, for example, in the case of "approximately constant", cases of completely constant and also cases of substantially constant.

The encapsulant 14 has a function to fill a gap between the solar cell 11 and the protection components, to seal the solar cell 11. The encapsulant 14 desirably has, as a primary constituent, a resin that can be applied for a lamination process to be described below. As the resin, ethylene vinyl acetate copolymer (EVA), polyvinylbutyral (PVB), or the like can be exemplified. The encapsulant 14 may include various additives such as an oxidation prevention agent, a flame resisting agent, an ultraviolet absorption agent, or the like, and the encapsulant 14 placed at the back surface side of the solar cell 11 may contain pigments such as titanium oxide.

As shown in FIGS. 1 and 2, in the solar cell module 10, a spacing between at least a part of the second wiring members 31 and the solar cell 11 positioned at an end of a row of the string 20 to which the wiring member is connected is narrower at a side of an end of the group of strings 30 in the lateral direction than at a side of a central portion in the lateral direction.

The group of strings 30 has, for example, a long-length wiring member 31L having a length longer than a length in a lateral direction of two rows of the strings 20, among the second wiring members 31 connected to the terminal portion 15. In the present embodiment, as shown in FIG. 2, strings 20a and 20f positioned at the ends of the group of strings 30 are connected to the terminal portion 15 by long-length wiring members 31La and 31Lb, respectively. In addition, adjacent strings 20b and 20c, and adjacent strings 20d and 20e are respectively connected by second wiring members 31a and 31b, and one end of each of these wiring members is connected to the terminal portion 15.

A spacing between the long-length wiring member 31La and the solar cell 11 positioned at an end of the row of the string 20a to which the wiring member is connected is narrower at the side of the end of the group of strings 30 in the lateral direction than at the side of the central portion in the lateral direction. Similarly, a spacing between the long-length wiring member 31Lb and the solar cell 11 positioned at an end of the row of the string 20f to which the wiring member is connected is narrower at the side of the end of the group of strings 30 in the lateral direction than at the side of the central portion in the lateral direction. In other words, the spacings between the long-length wiring members 31La and 31Lb and the solar cells 11 of the strings to which the wiring members are connected are narrower at the side of the end, of the first protection component 12 which is the curved substrate, in the lateral direction than at the side of the central portion in the lateral direction. In addition, the spacing becomes narrower as a distance from the terminal portion 15 is increased in the lateral direction of the group of strings 30. Because the second wiring members 31 are symmetrical in the left and right direction with respect to the central portion of the group of strings 30 in the lateral direction, in the following description, the side including the string 20a and the long-length wiring member 31La will be exemplified for the description.

In the string 20a, desirably, a plurality of first wiring members 21 extend in the longitudinal direction from a region above the solar cell 11 positioned at the end of the row and are connected to the long-length wiring member 31La. In the string 20a (in the present embodiment, other strings are similar), for example, two adjacent solar cells 11 are connected by three first wiring members 21 arranged in the lateral direction. Desirably, a length of the first wiring member 21, more specifically, at least a length of extension (extension length) of the first wiring member 21 from a region above the solar cell 11 positioned at the end of the row of the string 20a in the longitudinal direction, becomes shorter toward the end of the group of strings 30 in the lateral direction.

Specifically, the extension lengths of the three first wiring members 21 (referred to, from left to right in FIG. 2, as first wiring members 21a, 21b, and 21c) of the string 20a are in a relationship: the length of the first wiring member 21a<21b<21c. The long-length wiring member 31La is connected to a tip of each of the first wiring members. With such a configuration, the spacing between the long-length wiring member 31La and the solar cell 11 of the string 20a is set narrower at the side of the end of the group of strings 30 in the lateral direction than at the side of the central portion in the lateral direction.

The long-length wiring member 31La is desirably curved along the curved surface of the first protection component 12. The long-length wiring member 31La is curved, for example, along a virtual curve α having a constant curvature along the curved surface of the first protection component 12. With such a configuration, for example, a distortion of the long-length wiring member 31La can be reduced, and the load applied to the wiring member can be reduced. When the long-length wiring member 31La is curved along the virtual curve α, it becomes easier for a part of the strings 20 (for example, string 20a) to move toward the inner side of the group of strings 30. In the present embodiment, this movement is suppressed by adjusting the spacing between the long-length wiring member 31La and the solar cell 11 of the string 20a. That is, even when the long-length wiring member 31La is curved along the curved surface of the first protection component 12, narrowing of the spacing between the strings 20 at a part thereof can be prevented, and consequent contact of the solar cells 11 can be prevented.

In the present embodiment, the spacings between the second wiring members 31a and the solar cells 11 of the strings 20b and 20c are approximately equal to each other. In addition, the spacings between the second wiring members 31b and the solar cells 11 of the strings 20d and 20e are approximately equal to each other. The extension lengths of the first wiring members 21 in these strings are also approximately equal to each other. Alternatively, the spacing between the second wiring members 31a and 31b and the solar cells 11 of the strings to which the wiring members are connected may be set narrower at the side of the end of the group of strings 30 in the lateral direction than at the side of the central portion in the lateral direction. Alternatively, the spacing between the second wiring member 31 and the solar cell 11 of the string 20 may be adjusted by setting the extension lengths of the first wiring members 21 approximately equal to each other and changing a connection position with the second wiring member 31.

The solar cell module 10 having the above-described structure can be manufactured by laminating the group of strings 30 using resin sheets forming the first protection component 12, the second protection component 13, and the encapsulant 14. In a laminating device, the first protection component 12, a first resin sheet forming the encapsulant 14, the group of strings 30, a second resin sheet forming the encapsulant 14, and the second protection component 13 are layered in sequence over a heater. From the viewpoint of productivity or the like, the group of strings 30 is placed over the first protection component 12 after being manufactured on a flat surface, as will be described later. The layered structure is heated, for example, to a temperature at which the resin sheet forming the encapsulant 14 is softened under a vacuum state. Then, the heating is continued while the constituent members are pressed toward the heater side under an atmospheric pressure, to laminate the members, and to consequently obtain the solar cell module 10.

Figure 4:
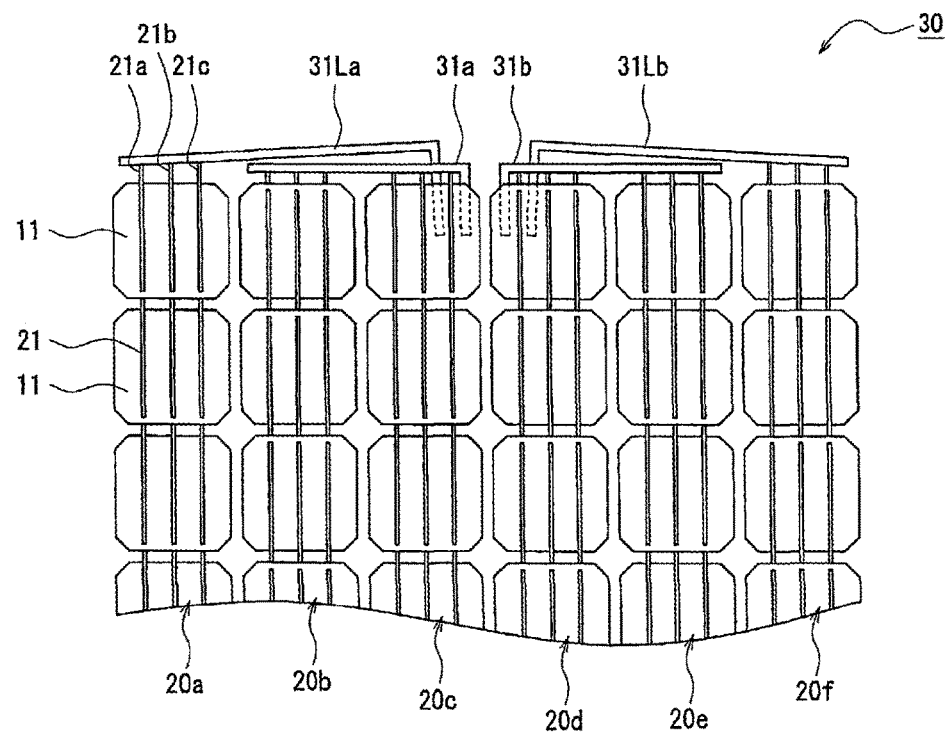
FIG. 4 is a diagram for explaining a method of manufacturing the solar cell module according to the first embodiment of the present disclosure.

FIG. 4 shows the group of strings 30 manufactured on a flat surface (and before being placed over the substrate).

As shown in FIG. 4, the group of strings 30 is manufactured by forming, on a flat surface, the string 20 by connecting the plurality of solar cells 11 in the longitudinal direction by the first wiring members 21, and connecting the second wiring member 31 to the first wiring member 21 of each string. In the present embodiment, the second wiring members 31a and 31b have an L-shape, large portions thereof extend in the lateral direction, and the second wiring members 31a and 31b are connected respectively to the first wiring members 21 of the strings 20b and 20c and the wiring members 21 of the strings 20d and 20e.

Meanwhile, the long-length wiring members 31La and 31Lb also have an L-shape, but are not formed to extend straight in the lateral direction, unlike the second wiring members 31a and 31b, and are tilted in the longitudinal direction to be distanced away from the string 20 toward the central portion of the group of strings 30 in the lateral direction. By placing the group of strings 30 having such a shape over the first protection component 12 and laminating with the above-described constituting members, the long-length wiring member 31La is curved along the curved surface of the first protection component 12, and the solar cell module 10 having the above-described structure is obtained.

Specifically, an example manufacturing method of the solar cell module 10 includes the following steps:

(1) connecting adjacent solar cells 11 in the longitudinal direction by the first wiring member 21, to form a plurality of strings 20 in each of which a plurality of solar cells 11 are arranged in one line;

(2) connecting the second wiring member 31 to a first wiring member 21 which extends from a region above a solar cell 11 positioned at an end of the row of the string 20 in a longitudinal direction, to connect adjacent strings 20 by at least a part of the second wiring member 31, to consequently form the group of strings 30; and (3) placing the group of strings 30 over the first protection component 12 which is the substrate which is curved in the longitudinal direction and in the lateral direction.

When the group of strings 30 is formed, a spacing between at least a part of the second wiring members 31 and the solar cell 11 positioned at the end of the row of the string 20 to which the wiring member is connected is set to be narrower at the side of the end of the group of strings 30 in the lateral direction than at the side of the central portion in the lateral direction. That is, the second wiring member 31 is connected to the first wiring member 21 so that the spacing is narrower at the side of the end of the group of strings 30 in the lateral direction than at the side of the central portion in the lateral direction.

When the group of strings 30 is formed, the long-length wiring member 31La is connected to the first wiring member 21 in such a manner that the spacing between the long-length wiring member 31La and the solar cell 11 of the string 20a is narrower at the side of the end of the group of strings 30 in the lateral direction than at the side of the central portion in the lateral direction (similarly for the case of the long-length wiring member 31Lb). In the present embodiment, a plurality of first wiring members 21 extend from a region above the solar cell 11 positioned at the end of the row of the string 20a, the lengths of the first wiring members are set to be shorter toward the end of the group of strings 30 in the lateral direction, and the long-length wiring member 31La is connected to the tip of each of the first wiring members.

As described above, according to the solar cell module 10 having the above-described structure, distortion of the wiring member can be reduced and the load on the wiring member can be reduced. According to the solar cell module 10, even when the second wiring member 31 is curved along the curved surface of the first protection component 12, the spacing between the strings 20 can be easily maintained at a constant spacing. With such a configuration, a superior arrangement state of the solar cells 11 (strings 20) can be obtained without occurrence of the short-circuiting, cell cracking, or the like due to contact between the solar cells 11. In addition, the load on the first wiring member 21 can be reduced as well as the load on the second wiring member 31, and, for example, a superior outer appearance and a high reliability can be obtained.

Second Embodiment

A solar cell module 50 according to a second embodiment of the present disclosure will now be described in detail with reference to FIGS. 5 and 6. In the following, constituent elements similar to those in the above-described embodiment are assigned the same reference numerals and will not be described again.

Figure 5:
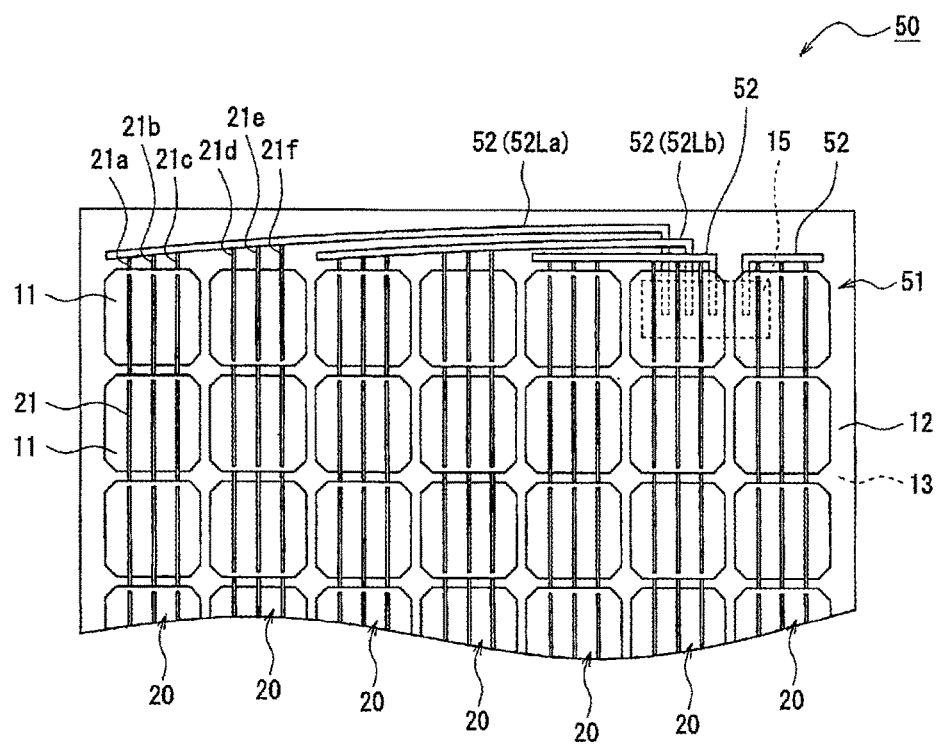
FIG. 5 is a plan view of a solar cell module according to a second embodiment of the present disclosure, viewed from a light receiving surface side.

As shown in FIG. 5, the solar cell module 50 differs from the solar cell module 10 in that seven strings 20 form a group of strings 51, and that second wiring members 52 are not symmetrical in the left and right direction with respect to the central portion of the group of strings 51 in the lateral direction. In the solar cell module 50 also, spacings between long-length wiring members 52La and 52Lb and solar cells 11 positioned at ends of the rows of the strings to which the wiring members are connected are narrower at a side distanced from the terminal portion 15 in the lateral direction of the group of strings 51 than at a side closer to the terminal portion 15.

The solar cell module 50 differs from the solar cell module 10 in that both long-length wiring members 52La and 52Lb connect adjacent strings 20, unlike the long-length wiring members 31La and 31Lb. Extension lengths of six first wiring members 21 connected to the long-length wiring member 52La (similarly for the long-length wiring member 52Lb) are shorter at a side of the group of strings 51 distanced from the terminal portion 15 than at a side closer to the terminal portion 15. In other words, the extension lengths of the six first wiring members 21 are in a relationship: the length of the first wiring member $21a < 21b < 21c < 21d < 21e < 21f$.

Figure 6:
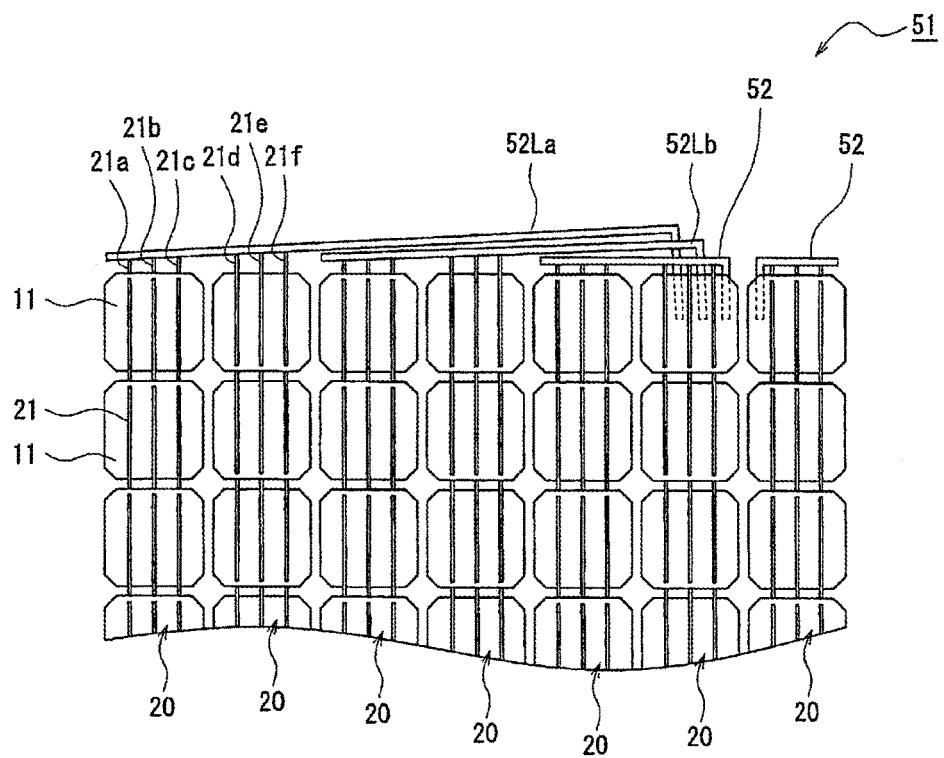
FIG. 6 is a diagram for explaining a method of manufacturing the solar cell module according to the second embodiment of the present disclosure.

As shown in FIG. 6, in the manufacturing process of the solar cell module 50, similar to the case of the solar cell module 10, first, the group of strings 51 is manufactured on a flat surface. In this case also, a plurality of first wiring members 21 are set to extend from a region above the solar cell 11 positioned at an end of the row of the string 20, and the lengths of the first wiring members are set in such a manner that the length becomes shorter toward the end of the group of strings 51 in the lateral direction. The long-length wiring members 52La and 52Lb are respectively connected to the tips of the first wiring members. The group of strings 51 thus manufactured is placed over the first protection component 12 and laminated with the constituting members, so that the long-length wiring members 52La and 52Lb are curved along the curved surface of the first protection component 12 and the solar cell module 50 having the above-described structure is obtained.

In the above-described embodiments, a configuration is exemplified in which the spacing between the long-length wiring member and the solar cell of the string is varied. Alternatively, a configuration may be employed in which a spacing between a wiring member having a shorter length than a length of two rows of strings in the lateral direction and the solar cell of the string is narrower at the side of the end of the substrate in the lateral direction than at the side of the central portion in the lateral direction. Alternatively, a configuration may be employed for the solar cell module in which a spacing between all second wiring members, including a second wiring member that connects only adjacent strings, and the solar cell of the string is narrower at the side of the end of the substrate in the lateral direction than at the side of the central portion in the lateral direction.

REFERENCE SIGNS LIST 10, 50 SOLAR CELL MODULE; 11 SOLAR CELL; 12 FIRST PROTECTION COMPONENT; 13 SECOND PROTECTION COMPONENT; 14 ENCAPSULANT; 15 TERMINAL PORTION; 20, 20a, 20b, 20c, 20d, 20e, 20f STRING; 21, 21a 21b, 21c, 21d, 21e, 21f FIRST WIRING MEMBER; 30, 51 GROUP OF STRINGS; 31, 31a, 31b, 52 SECOND WIRING MEMBER; 31L, 31La, 31Lb, 52La, 52Lb LONG-LENGTH WIRING MEMBER.

The invention claimed is:

1. A solar cell module, comprising:
a substrate which is curved in a longitudinal direction and in a lateral direction;
a plurality of solar cells placed over the substrate;
first wiring members that connect adjacent solar cells of the plurality of the solar cells to each other in a longitudinal direction to form a plurality of strings in each of which a part of the plurality of solar cells are arranged in one line; and
second wiring members that are connected to the first wiring members which extend from a region above the solar cells positioned at a lateral side of the strings, and at least one of which connects adjacent strings to form a group of strings in the lateral direction, wherein
a spacing between a long-length wiring member of the second wiring members and the solar cells positioned at the lateral side of the strings is narrower at a side of an end of the plurality of strings in the lateral direction than at a side of a central portion in the lateral direction, and
a length of the long-length wiring member in the lateral direction is longer than a length of two strings of the plurality of the strings in the lateral direction, and
an entirety of a substantially lateral part of the long-length wiring member is free of direct overlap with the plurality of solar cells.

2. The solar cell module according to claim 1, further comprising:
a terminal portion to which at least one of the second wiring members is connected, wherein;
a first solar cell of the plurality of solar cells directly adjacent to the terminal portion,
a second solar cell of the plurality of solar cells directly adjacent to the second wiring members and further from the terminal portion than the first solar cell,
a spacing between the long-length wiring member and the second solar cell is narrower than a second spacing between the long-length wiring member and the first solar cell.

3. The solar cell module according to claim 2, wherein
a plurality of the first wiring members extend from a region above the solar cell positioned at the lateral side of the strings and are connected to the long-length wiring member, and
a length of the first wiring member is shorter at a side of the plurality of strings distanced from the terminal portion in the lateral direction than at a side closer to the terminal portion in the lateral direction.

4. The solar cell module according to claim 1, wherein the long-length wiring member is curved along a curved surface of the substrate.

5. The solar cell module according to claim 1, wherein the closer the long-length wiring member is to an end of the plurality of strings in the lateral direction, the narrower spacing is between the long-length wiring member and the solar cells position at the lateral side of the strings.

* * * * *